United States Patent [19]

Wiesner

[11] 4,319,077

[45] Mar. 9, 1982

[54] CIRCUIT FOR CODED SYMBOL CONVERSION

[75] Inventor: Wolfgang Wiesner, Germering, Fed. Rep. of Germany

[73] Assignee: Siemens Aktiengesellschaft, Berlin & Munich, Fed. Rep. of Germany

[21] Appl. No.: 172,074

[22] Filed: Jul. 24, 1980

[30] Foreign Application Priority Data

Sep. 18, 1979 [DE] Fed. Rep. of Germany ....... 2937725

[51] Int. Cl.³ .................... G06F 3/14; H04L 13/08
[52] U.S. Cl. .................... 178/17 C; 178/23 R; 178/30
[58] Field of Search ........... 364/900; 178/17.5, 26 R, 178/26 A, 23 R, 30, 17 C; 400/109, 111

[56] References Cited

U.S. PATENT DOCUMENTS 4,072,820 2/1978 Günther ..................... 178/23 R
4,145,570 3/1979 Diab ........................ 178/30

*Primary Examiner*—Thomas A. Robinson
*Attorney, Agent, or Firm*—Hill, Van Santen, Steadman, Chiara & Simpson

[57] ABSTRACT

A circuit for coded symbol conversion has first and second memories and a switching stage. Standard code characters from a keyboard are entered into the first memory and if the entered character is one which can be represented by a single binary word the switching stage enables transmission of the single word. If the entered character is one requiring more than one binary word for representation the input is transmitted to the second memory which generates an equivalent set of binary words to represent the symbol and further transmission is delayed until all such binary words are generated.

9 Claims, 3 Drawing Figures

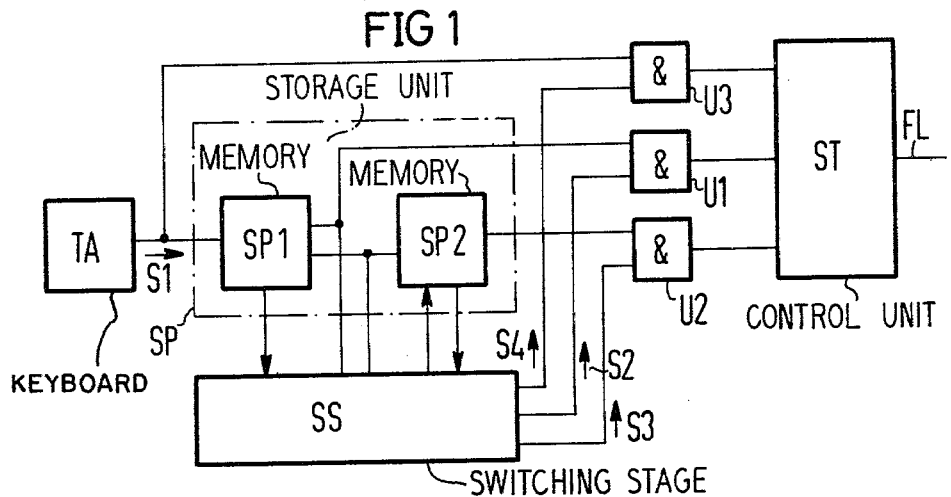

CIRCUIT FOR CODED SYMBOL CONVERSION

BACKGROUND OF THE INVENTION

1. Field of the Invention

The present invention relates to a circuit for coded symbol conversion, and in particular to such a circuit for converting information resulting from keyboard actuation into coded characters such as may be used in teleprinters.

2. Description of the Prior Art

An international convention has been adopted with regard to teleprinter characters utilizing CCITT Code No. 2 by which certain special characters or symbols are impermissible and therefore cannot be transmitted. Such symbols are, for example, certain German vowels having an umlaut such as ä, ö and ü, as well as symbols representing a paragraph, degrees, exponents, and others. The general practice is to represent these impermissible characters by double or triple characters such as ae, oe and ue in the case of vowels with umlauts and "par" in place of a paragraph sign. German Pat. No. 25 42 864 corresponding to U.S. Pat. No. 4,072,820 discloses and claims a circuit for the generation of double characters of this type following the actuation of an appropriate key on a keyboard. The circuit described therein contains a counter which employs a decoder and a multiplexer to successively check the actuation of the keys which are arranged in the form of a matrix. When a certain key has been actuated, the corresponding count is transferred into a storage. When a key assigned to a double symbol is actuated, the transfer of the count is momentarily blocked and the respective counts assigned to the code characters in the double symbol is awaited. This circuit has the disadvantage of not being useable with commercially available keyboard modules which generate conventional signals following the actuation of a key on the keyboard.

SUMMARY OF THE INVENTION

It is an object of the present invention to provide a circuit utilizable with conventional keyboard arrangements for the conversion of symbols into code characters which are entered into the system through the keyboard and which provides output code characters or a plurality of code characters in accordance with the particular symbol entered into the system.

The above object is inventively achieved in a circuit in which a first memory is connected to the keyboard in which is stored a data word for each character represented on the keyboard. For symbols which can be directly represented by a single code character the data word contains the code character. For special characters or a symbol for which no single code character exists, the data word contains an address word. A second memory connected to the first memory contains, at addresses corresponding to the address words in the first memory, a plurality of further data words which contain code characters which are descriptive of the symbol. A switching stage is connected to both memories which, upon the entering of a symbol via the keyboard, functions to either switch the code character from the first memory to an output control unit or switches the plurality of code characters from the second memory to the output control unit.

The above circuit has a relatively simple structure requiring a low outlay and moreover allows the special characters and symbols to be transmitted in an intelligible manner, such as by a teleprinter.

Further economy can be obtained if the first and second memories are portions of a single storage unit. Each memory may consist of a read only memory (ROM), or if frequent modification is anticipated the first and second memories may be programmable read only memories (PROM). Moreover, the memories and the switching stage may form a part of a microcomputer.

In order to distinguish whether the switching stage is to switch through to the control unit either the code characters contained in a single data word or the code characters contained in additional data words, it is preferable for the data words to contain binary symbols in a specific location which characterize each entered symbol with respect to whether a single code character is available to represent the symbol.

If the second memory is of a capacity for storing relatively long data words it is preferable for each of the additional data words to contain the entire sequence of code characters necessary to represent the entered symbol. If the second memory does not have such storage capacity, each of the additional data words representing the individual code characters necessary to represent the entered symbol can be contained in separate data words, in which case the additional data words contain a binary symbol in a specific location which identifies the last data word assigned to a symbol. For the processing of control signals which do not represent symbols to be transmitted, predetermined combinations of binary symbols in the data words are utilized to instruct the switching stage to switch through to the control unit at least a part of the signals emitted from the keyboard, thereby bypassing the memories.

DESCRIPTION OF THE DRAWINGS

FIG. 1 is a schematic block diagram of a circuit for converting coded symbols constructed in accordance with the principles of the present invention.

FIG. 2 is a table of a portion of the data words contained in the first memory of FIG. 1.

FIG. 3 is a table of a portion of the additional data words stored in the second memory of FIG. 1.

DESCRIPTION OF THE PREFERRED EMBODIMENTS

A circuit for converting coded symbols into transmissible characters which may form a part of a printer station such as, for example, a teleprinter, is shown in FIG. 1. A conventional keyboard TA having a plurality of keys bearing characters thereon is arranged in the printer station and is utilized to enter symbols into the printer which are to be eventually transmitted via a trunk line FL to a further printer station. The keyboard TA generates signals S1 which are assigned to a particular key actuated on the keyboard, and which are transmitted to a storage unit SP which contains a first memory SP1 and a second memory SP2. The memories SP1 and SP2 may, for example, each be a read only memory.

If the signals S1 represent a symbol which can be transmitted by a code character via the trunk line FL, for example a teleprinter character coded in accordance with CCITT Code No. 2, a data word containing this code character is read out from the memory SP1. The signals S1 in this situation serve as an address for addressing the particular word. In addition to the binary code character for the particular symbol, the data word contains a binary symbol in a specific location which characterizes the code character as a letter or a digit and also has a binary symbol in a specific location which characterizes the character as lower case or upper case. In addition, a binary symbol is present in the data word which indicates whether the symbol is one which may be represented by a single code character.

A switching stage SS connected to each of the memories SP1 and SP2 analyzes these binary symbols and if the symbol can be represented by a single code character, the switching stage SS generates a signal S2 to a first AND gate U1, which has as its other input the output of the first memory SP1, thereby enabling the code character contained in the data word which is the output of the first memory SP1 to be transmitted to a control unit ST for further transmission on the trunk line FL. If, however, the signals S1 represent a symbol which cannot be represented by a code character such as for example the symbols ä, ö, ü, §, %, or &, the corresponding data word stored in the memory SP1 is stored as an address word which is fed to the memory SP2, instead of being stored as a code character. From the corresponding binary character and data word, the switching stage SS recognizes the nature of this character as one which cannot be directly transmitted. At the address in the second memory SP2 corresponding to the address word received from the memory SP1, the memory SP2 stores a number of data words which contain code characters descriptive of the special character or symbol. For example, the special character ä is described by the code characters for ae, and the symbol § may be described by the code characters for the letters "par". The symbols may of course be changed on the keyboard keys in accordance with different conventions so that the symbol for paragraph may also be "¶".

As controlled by the switching stage SS, the corresponding data words are read out from the memory SP2 and the code characters are switched through to the control unit ST by the generation of an enabling signal S3 which serves as one input to a second AND gate U2 which has the output of the second memory SP2 as its other input. The additional data words stored in the memory SP2 also contain binary symbols characterizing whether the symbol is a letter or digit and is in a normal or shifted setting. Each of the additional data words has a binary character which is at a first value for such time as the additional data words are needed and which assumes a second value for the last data word in a sequence representing the special character. When the binary character in that location assumes the second binary value, the switching stage SS is thereby informed that this data word contains the last code character for the representation of the symbol which is to be transmitted. If control signals which do not represent symbols to be transmitted are entered by means of the keyboard TA, the corresponding positions in the memory SP1 each contain a data word consisting only of binary values 1. In such a case, the switching stage SS generates an enabling signal S4 to a third AND gate U3 which has a direct connection to the keyboard TA as its other input so that a least a part of the signal S1 is transmitted through to the control unit ST.

The operation of the circuit of FIG. 1 will be further explained with the aid of the table shown in FIG. 2 which represents a portion of the data stored in the first memory SP1, and the table shown in FIG. 3 which represents a portion of the data stored in the memory SP2. The addresses AD1 shown in FIG. 2 correspond to the signals S1 generated by actuation of keys on the keyboard TA. For example, the signals S1 comprising the binary values 10001011 represent the character Y. The address in the memory SP1 stores in the form of a data word, a binary character sequence which is comprised of the binary symbols B1, B2 and B3 as well as the binary symbols in the group F1 which are the binary symbols representing the character Y in CCITT Code No. 2. If the key for the character Y is now actuated on the keyboard TA, the data word 01010101 is read out at the address represented by the signals S1. Because the word has a binary value 0 in the binary location B1, it is known that a key has been depressed corresponding to a symbol which can be represented by a single code character. By virtue of the binary value 1 in the symbol location B2, it is known that the character corresponding to the actuated key is a capital letter and has been entered in the shift position of the keyboard. By virtue of a binary value 0 in the binary location B3, it is known that this is a code character representing a letter. As already stated, the binary symbols grouped in F1 represent the code character for the letter Y. A signal assigned to the binary symbol B1 is transmitted to the switching stage SS which then switches through the binary characters F1 by generating the enabling signal S2 to the first AND gate U1.

If, for example, the key on the keyboard TA for the symbol is actuated, the signals S1 assume the binary values 10001100. At this address AD1, the memory SP1 stores the data word comprising the binary symbol 10011001. In this case, the binary symbol B1 is a 1 which indicates that this is a symbol which cannot be represented by a single code character. The following binary symbols at the locations B2, B3 and F1 in this case do not represent a code character but rather form an address word which is transmitted to the second memory SP2.

In the second memory SP2 a data word having the binary values 10010110 is stored at an address AD20011001 which is formed from the binary symbols at the locations B2, B3 and F1 in the first memory SP1. In the data word contained in the second memory SP2, a binary value 1 at a binary location B4 indicates that further data words must be read out until such time as the total number of data words needed to represent the symbol have been read out, at which time a 0 value will occur at the B4 location. The binary symbols at the locations B5 and B6 respectively correspond to the symbols contained at the locations B2 and B3, and the binary symbols grouped at F2 represent code characters in the form of teleprinter characters utilizing CCITT Code No. 2. If the data word is called up, the binary characters F2 which are assigned to the letter p are transferred to the control unit ST. Because the binary location B4 as the binary value 1, the following data word having the binary symbols in the group F2 representing the letter a is also read out from the second memory SP2. Because the binary symbol at the location B4 for this data word also has the binary value 1, another following data word is also read out, this data word having the binary symbols in the group F2 representing the character r. This data word, however, contains a binary value of 0 at the location B4, as a result of which the switching stage SS is informed that all of the data words descriptive of the symbol § have been read out of the second memory SP2. Thus, in place of the symbol § the code characters for the letters "par" are transmitted which are descriptive of the symbol §.

The following table represents code characters which may be transmitted to the control unit ST in place of the symbols appearing in the left column. It will be understood that the table is for representative purposes only, and other symbols may be represented without departing from the inventive concept disclosed herein.

| Symbols on Key | Printed Characters |
| --- | --- |
| a | ae |
| o | oe |
| u | ue |
| β (sz) | ss |
| ° (degrees) | deg |
| μ | mu |
| § | par |
| $ | dol |
| % | o/o |
| # | no |
| 2 (squared) | exp 2 |
| 3 (cubed) | exp 3 |
| | stg |

Although modifications and changes may be suggested by those skilled in the art it is the intention of the inventor to embody within the patent warranted hereon all changes and modifications as reasonably and properly come within the scope of his contribution to the art.

I claim as my invention:

1. A circuit for converting input signals into coded characters for use in a printing station having a keyboard with a plurality of actuatable keys representing directly and non-directly transmissible symbols, each key generating a different one of said input signals upon actuation thereof, said circuit comprising:
    a first memory having an input connected to said keyboard and having stored therein a plurality of addressable binary data words for said symbols, each data word having a plurality of binary locations,
        with data words for said directly transmissible symbols containing a coded character for one of said directly transmissible symbols, and data words for said non-directly transmissible symbols containing an address word;
    a second memory connected to said first memory having a plurality of address locations corresponding to said address words in said first memory, said second memory storing at said address locations a plurality of additional data words each containing at least one coded character for representing one of said non-directly transmissible symbols;
    a switching stage connected to each of said first and second memories;
    a control unit interconnected between each of said switching stage, said first memory, said second memory and a data trunk line,
    said switching stage generating an enabling signal for enabling transmission of the output of said first memory through said control unit to said data trunk line if a key is actuated representing a directly transmissible symbol, and for enabling transmission of the output of said second memory through said control unit to said data trunk line if a key is actuated representing a non-directly transmissible symbol.

2. The circuit of claim 1 wherein said first and second memories comprise respective portions of a single storage unit.

3. The circuit of claim 1 wherein said first and second memories are read only memories.

4. The circuit of claim 1 wherein said first and second memories and said switching stage are respective portions of a micro-computer.

5. The circuit of claim 1 wherein each of said binary data words in said first memory has a binary symbol at a first binary location for representing whether the data word contains a coded character.

6. The circuit of claim 1 wherein each of said additional data words in said second memory has a first binary location for representing whether the additional data word is a last data word for said non-directly transmissible symbol.

7. The circuit of claim 1 wherein a portion of said plurality of actuatable keys are actuatable to generate control signals and wherein said first memory generates a signal to said switching stage upon actuation of one of said control signal keys for enabling direct transmission of said control signal to said control unit bypassing said first and second memories.

8. The circuit of claim 1 further comprising:
    a first AND gate having a pair of inputs respectively connected to the output of said first memory and to said switching stage, and having an output connected to said control unit whereby said first AND gate allows transmission of the output of said first memory to said control unit upon the appearance of said enabling signal from said switching stage; and
    a second AND gate having a pair of inputs respectively connected to the output of said second memory and to said switching stage, and having an output connected to said control unit whereby said second AND gate allows transmission of the output of said second memory to said control unit upon the occurrence of said enabling signal from said switching stage.

9. The circuit of claim 7 further comprising a control AND gate having a pair of inputs respectively connected to said keyboard and to said switching stage and having an output connected to said control unit whereby said control AND gate allows direct transmission of a control signal from said keyboard to said control unit upon the occurrence of said enabling signal from said switching stage.

* * * * *